(12) United States Patent
Sasaki et al.

(10) Patent No.: US 6,364,964 B1
(45) Date of Patent: Apr. 2, 2002

(54) MANUFACTURING METHOD OF SPIN VALVE MAGNETORESISTIVE EFFECT ELEMENT AND MANUFACTURING METHOD OF THIN-FILM MAGNETIC HEAD WITH THE ELEMENT

(75) Inventors: Tetsuro Sasaki; Noriyuki Ito; Koichi Terunuma, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/655,404

(22) Filed: Sep. 5, 2000

(30) Foreign Application Priority Data

Sep. 6, 1999 (JP) ............................................. 11-251479

(51) Int. Cl.[7] ............................................. H01F 10/32
(52) U.S. Cl. ..................................... 148/121; 29/603.08
(58) Field of Search .................................. 148/121, 122; 29/603.08

(56) References Cited

U.S. PATENT DOCUMENTS

| 5,777,542 A | * | 7/1998 | Ohsawa et al. ............ 338/32 R |
| 6,033,491 A | * | 3/2000 | Lin ............................ 148/108 |
| 6,123,780 A | * | 9/2000 | Kanai et al. ................ 148/108 |
| 6,221,172 B1 | * | 4/2001 | Saito et al. ................. 148/108 |
| 6,295,718 B1 | * | 10/2001 | Liao ......................... 29/603.08 |
| 6,302,970 B1 | * | 10/2001 | Shimazawa et al. ........ 148/108 |

FOREIGN PATENT DOCUMENTS

| JP | 11-96516 | 4/1999 |
| JP | 11-97763 | 4/1999 |

* cited by examiner

*Primary Examiner*—John Sheehan
(74) *Attorney, Agent, or Firm*—Armstrong, Westerman & Hattori, LLP

(57) ABSTRACT

The SVMR element has a non-magnetic metallic thin-film layer, first and second ferromagnetic thin-film layers (free and pinned layers) formed to sandwich the non-magnetic metallic thin-film layer and an anti-ferromagnetic thin-film layer formed in contact with a surface of the second ferromagnetic thin-film layer. This surface is opposite to the non-magnetic metallic thin-film layer. The first ferromagnetic thin-film layer has a two-layers structure of a NiFe layer and a CoFe layer. The manufacturing method includes a step of depositing the first ferromagnetic thin-film layer, the non-magnetic metallic thin-film layer, the second ferromagnetic thin-film layer and the anti-ferromagnetic thin-film layer, and a step of annealing, thereafter, the deposited layers so that change in magnetostriction depending upon variation of a thickness of the NiFe layer becomes small.

10 Claims, 6 Drawing Sheets

MANUFACTURING METHOD OF SPIN VALVE MAGNETORESISTIVE EFFECT ELEMENT AND MANUFACTURING METHOD OF THIN-FILM MAGNETIC HEAD WITH THE ELEMENT

FIELD OF THE INVENTION

The present invention relates to a method of manufacturing a spin valve magnetoresistive effect (SVMR) element utilizing a giant magnetoresistive effect (GMR) and to a method of manufacturing a thin-film magnetic head with the SVMR element, used in for example a hard disk device (HDD).

DESCRIPTION OF THE RELATED ART

Recently, thin-film magnetic heads with SVMR elements that provide one of GMR characteristics are actually mass-produced in order to satisfy the requirement for ever increasing data storage densities in today's magnetic storage systems like HDD units. The SVMR thin-film structure includes first and second thin-film layers of a ferromagnetic material separated by a thin-film layer of non-magnetic metallic material, and an adjacent layer of anti-ferromagnetic material is formed in physical contact with the second ferromagnetic layer to provide exchange bias magnetic field by exchange coupling at the interface of the layers. The magnetization direction in the second ferromagnetic layer is constrained or maintained by the exchange coupling, hereinafter the second ferromagnetic layer is called "pinned layer". On the other hand, the magnetization direction of the first ferromagnetic layer is free to rotate in response to an externally applied magnetic field, hereinafter the first ferromagnetic layer is called "free layer". The direction of the magnetization in the free layer changes between parallel and anti-parallel against the direction of the magnetization in the pinned layer, and hence the magneto-resistance greatly changes and GMR characteristics are obtained.

Japanese unexamined patent publication No. 11-97763 discloses that a magnetostriction constant $\lambda$ of a free layer in the SVMR element should be desired to be within a range of $-1.0 \times 10^{-6}$ to $+1.0 \times 10^{-6}$. This is because the asymmetry of output signal shape of the SVMR element will collapse if the magnetostriction constant $\lambda$ of the free layer becomes larger toward the positive side, and a magnetic wall may be produced in the free layer causing Bulkhauzen noises to increase if the absolute value of the magnetostriction constant $\lambda$ becomes large. Furthermore, if the magnetostriction constant $\lambda$ becomes larger toward the negative side, the coercive force Hk of the free layer increases causing the output of the SVMR element to reduce.

In order to keep the magnetostriction constant $\lambda$ of the free layer within the range of $-1.0 \times 10^{-6}$ to $+1.0 \times 10^{-6}$, Japanese unexamined patent publication No. 11-97763 proposes to make the free layer from a NiFe single layer with Ni-composition of 81.5 to 83.0 wt %.

Japanese unexamined patent publication No.11-96516 concerns a technique for controlling the magnetization direction of a pinned layer of a SVMR element and discloses to form a free layer in a two-layers structure of a NiFe layer and a CoFeB layer.

However, according to the known techniques disclosed in the above-mentioned Japanese unexamined patent publication Nos. 11-97763 and 11-96516, the magnetostriction constant of the free layer will vary depending upon the thickness change in the NiFe layer of the free layer. Namely, if the NiFe layer becomes thin, the magnetostriction will become large toward the positive direction and thus it is difficult to properly control the magnetostriction causing the production stability of SVMR element to spoil greatly.

SUMMARY OF THE INVENTION

It is therefore an object of the present invention to provide a manufacturing method of a SVMR element and a manufacturing method of a thin-film magnetic head with the SVMR element, whereby control of magnetostriction can be easily performed.

Another object of the present invention is to provide a manufacturing method of a SVMR element and a manufacturing method of a thin-film magnetic head with the SVMR element, whereby excellent production stability can be expected.

According to the present invention, a method of manufacturing a SVMR element and a manufacturing method of a thin-film magnetic head with the SVMR element are provided. The SVMR element has a non-magnetic metallic thin-film layer, first and second ferromagnetic thin-film layers (free and pinned layers) formed to sandwich the non-magnetic metallic thin-film layer and an anti-ferromagnetic thin-film layer formed in contact with a surface of the second ferromagnetic thin-film layer. This surface is opposite to the non-magnetic metallic thin-film layer. The first ferromagnetic thin-film layer has a two-layers structure of a NiFe layer and a CoFe layer. Particularly, according to the present invention, the method includes a step of depositing the first ferromagnetic thin-film layer, the non-magnetic metallic thin-film layer, the second ferromagnetic thin-film layer and the anti-ferromagnetic thin-film layer, and a step of annealing, thereafter, the deposited layers so that change in magnetostriction depending upon variation of a thickness of the NiFe layer becomes small.

According to the present invention, also, a method of manufacturing a SVMR element includes a step of depositing a first ferromagnetic thin-film layer (free layer) to form a two-layers structure of a NiFe layer and a CoFe layer, a step of depositing a non-magnetic metallic thin-film layer on the first ferromagnetic thin-film layer, a step of depositing a second ferromagnetic thin-film layer (pinned layer) on the non-magnetic metallic thin-film layer, a step of depositing an anti-ferromagnetic thin-film layer on the second ferromagnetic thin-film layer, and a step of annealing, thereafter, the deposited layers so that change in magnetostriction depending upon variation of a thickness of the NiFe layer becomes small.

According to the present invention, furthermore, a method of manufacturing a SVMR element includes a step of depositing an anti-ferromagnetic thin-film layer, a step of depositing a second ferromagnetic thin-film layer (pinned layer) on the anti-ferromagnetic thin-film layer, a step of depositing a non-magnetic metallic thin-film layer on the second ferromagnetic thin-film layer, a step of depositing a first ferromagnetic thin-film layer (free layer) on the non-magnetic metallic thin-film layer to form a two-layers structure of a CoFe layer and a NiFe layer, and a step of annealing, thereafter, the deposited layers so that change in magnetostriction depending upon variation of a thickness of the NiFe layer becomes small.

The free layer has a two-layers structure of a CoFe layer and a NiFe layer, and annealing is performed so that change in magnetostriction depending upon variation of a thickness of the NiFe layer becomes small. Thus, the magnetostriction constant of the free layer can be easily controlled within a desired range, for example within a range of $-1.0 \times 10^{-6}$ to $+1.0 \times 10^{-6}$, and therefore excellent production stability can be expected.

It is preferred that the CoFe layer has a thickness within a range of 1.2 to 4.3 nm.

It is also preferred that the NiFe layer has a thickness of 2 nm or more.

It is preferred that the NiFe layer has a composition of Ni within a range of 81 to 83 at %.

It is preferred that the CoFe layer has a composition of Fe within a range of 5 to 17 at %.

It is further preferred that the NiFe layer has a composition of Ni within a range of 81 to 83 at %, and the CoFe layer has a thickness within a range of 1.2 to 4.3 nm.

It is preferred that the annealing step includes annealing the deposited layers at a temperature of 200° C. or more.

Further objects and advantages of the present invention will be apparent from the following description of the preferred embodiments of the invention as illustrated in the accompanying drawings.

DESCRIPTION OF THE PREFERRED EMBODIMENTS

Figure 1:
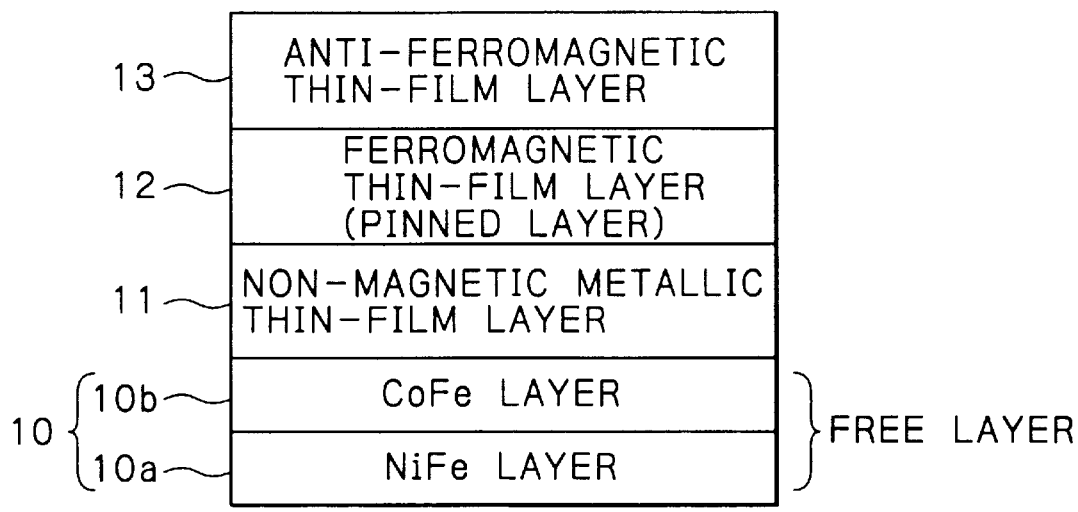
FIG. 1 is a sectional view of a SVMR multi-layered structure of a SVMR element manufactured as a preferred embodiment according to the present invention.

FIG. 1 illustrates a SVMR multi-layered structure of a SVMR element manufactured as a preferred embodiment according to the present invention.

In the figure, reference numerals 10 and 12 denote two ferromagnetic thin-film layers, namely a free layer and a pinned layer. A non-magnetic metallic thin-film layer 11 magnetically separates the free layer 10 and the pinned layer 12 so as to form a sandwich structure. An anti-ferromagnetic thin-film layer 13 is formed on the pinned layer 12 to make physical contact with this pinned layer. An exchange bias magnetic field produced by exchange coupling at the interface of these layers 12 and 13 is applied to the pinned layer 12 for pinning this layer 12. No exchange bias magnetic field is applied to the free layer 10 and thus the magnetization direction of this free layer 10 changes in response to an externally applied leakage magnetic field from a magnetic disk.

In this embodiment, particularly, the free layer 10 has a two-layers structure of a NiFe layer 10a and a CoFe layer 10b.

Now, manufacturing processes of the SVMR element according to this embodiment will be described in detail.

Figure 2:
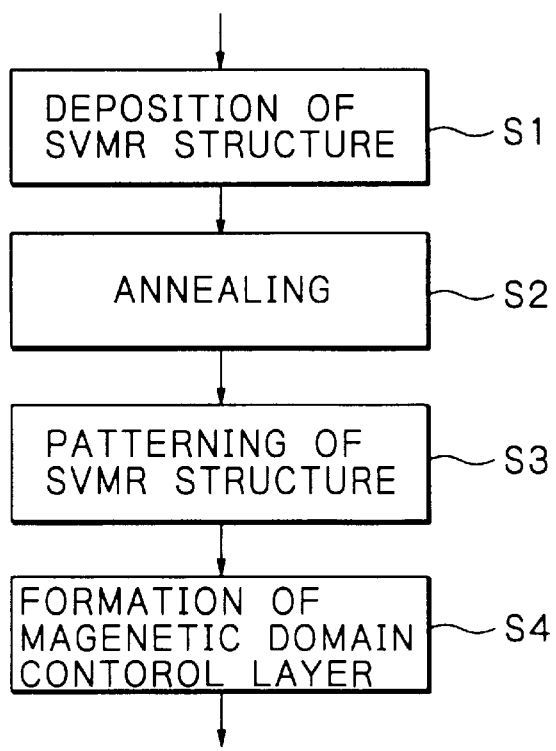
FIG. 2 is a flowchart illustrating mainly a deposition process of a SVMR structure including a free layer deposition process and an annealing process performed thereafter in the embodiment of FIG. 1.

FIG. 2 illustrates mainly a deposition process of a SVMR structure containing a free layer deposition process, and an annealing process performed thereafter in this embodiment.

First, a shield layer, a shield gap layer and an under layer for the SVMR structure are sequentially formed on an wafer, and then the SVMR structure is deposited on the under layer (step S1). In this deposition process, the free layer 10 with the two-layers structure of the NiFe layer 10a and the CoFe layer 10b, the non-magnetic metallic thin-film layer 11, the pinned layer 12 and the anti-ferromagnetic thin-film layer 13 are sequentially deposited in this order, as shown in FIG. 1.

It is desired that the NiFe layer 10a has a thickness of 2 nm or more and contains Ni-composition of 81 to 83 at %. It is also desired that the CoFe layer 10b has a thickness of 1.2 to 4.3 nm and contains Fe-composition of 5 to 17 at %.

Then, an annealing process or a heat-treatment process is performed so that the change of magnetostriction in the free layer 10, which depends on the change in the thickness of the NiFe layer 10a, becomes small (step S2). More specifically, in the annealing process, a temperature of the wafer with the SVMR structures is kept at 200° C. or more, preferably at about 250° C. for about 5 hours and then gradually lowered to the room temperature in about 5 hours.

Then, patterning of the SVMR structure is performed (step S3), and thereafter a magnetic domain control layer and a lead conductor layer are formed (step S4).

Following processes are substantially the same as that of the general fabrication process of thin-film magnetic heads.

According to this embodiment, since the annealing is done after the deposition of the SVMR structure, the change in the magnetostriction constant $\lambda$ of the free layer 10 depending upon the thickness of the NiFe layer 10a can be stopped to the minimum extent.

Figure 3:
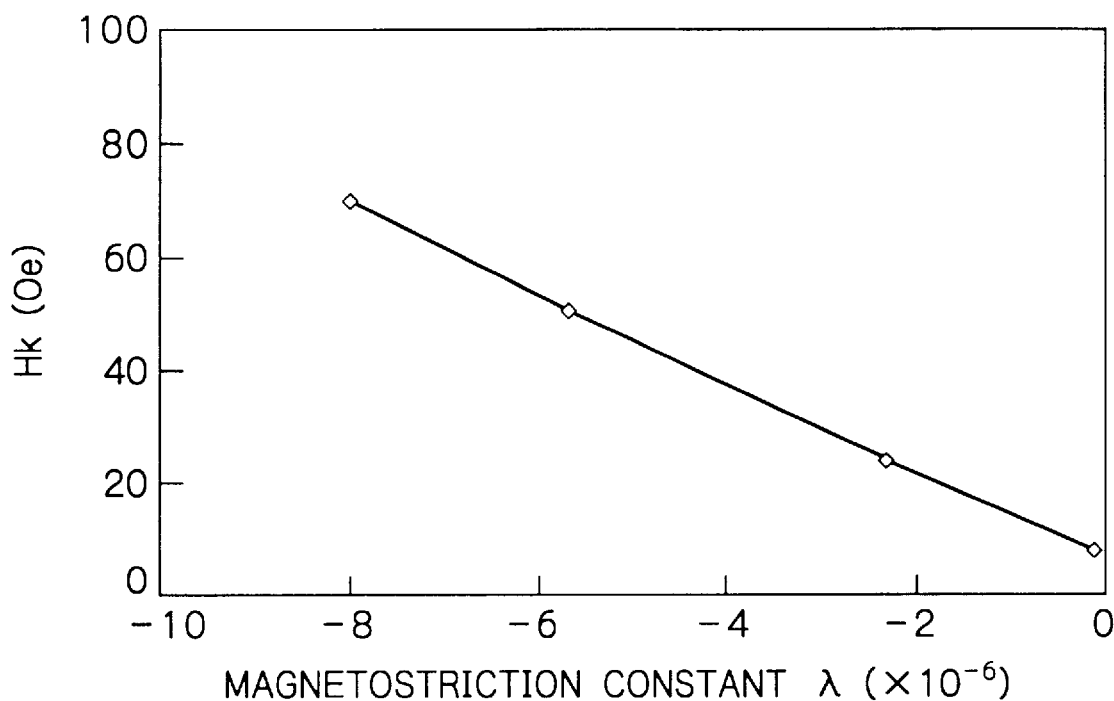
FIG. 3 illustrates characteristics of a coercive force Hk of the free layer with respect to a magnetostriction constant $\lambda$.

In general, the larger the magnetostriction constant $\lambda$ becomes toward the negative side, the more the coercive force Hk of the free layer 10 increases as shown in FIG. 3.

Figure 4:
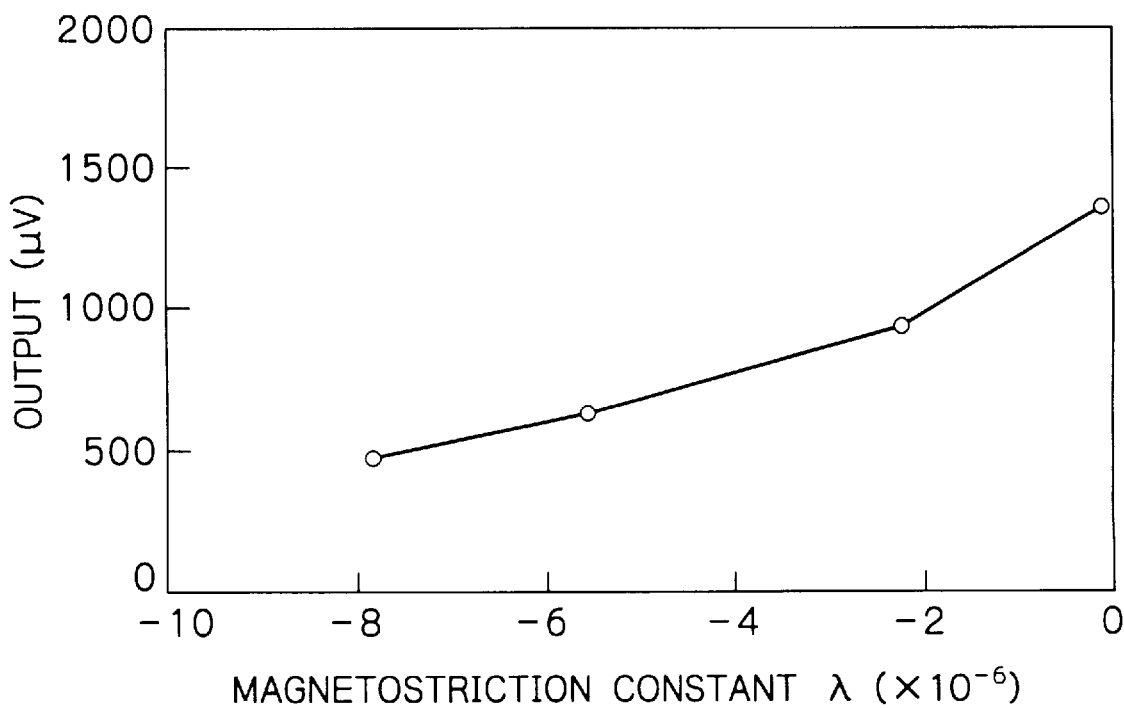
FIG. 4 illustrates characteristics of an output of the SVMR element with respect to a magnetostriction constant $\lambda$.

Also, the larger the magnetostriction constant $\lambda$ becomes toward the negative side, the more the output of the SVMR element reduces as shown in FIG. 4. However, according to this embodiment, the magnetostriction constant $\lambda$ of the free layer can be easily controlled within a predetermined range, for example within a range of $-1.0 \times 10^{-6}$ to $+1.0 \times 10^{-6}$, and therefore excellent production stability can be expected.

In a modification of the aforementioned embodiment, the SVMR structure may be formed by sequentially depositing the anti-ferromagnetic thin-film layer 13, the pinned layer 12, the non-magnetic metallic thin-film layer 11 and the free layer 10 with the two-layers structure of the CoFe layer 10b and the NiFe layer 10a in this order on the under layer.

Hereinafter, desired constitutions of the free layer and desired annealing conditions obtained by experiments using various samples will be described.

Figure 5:
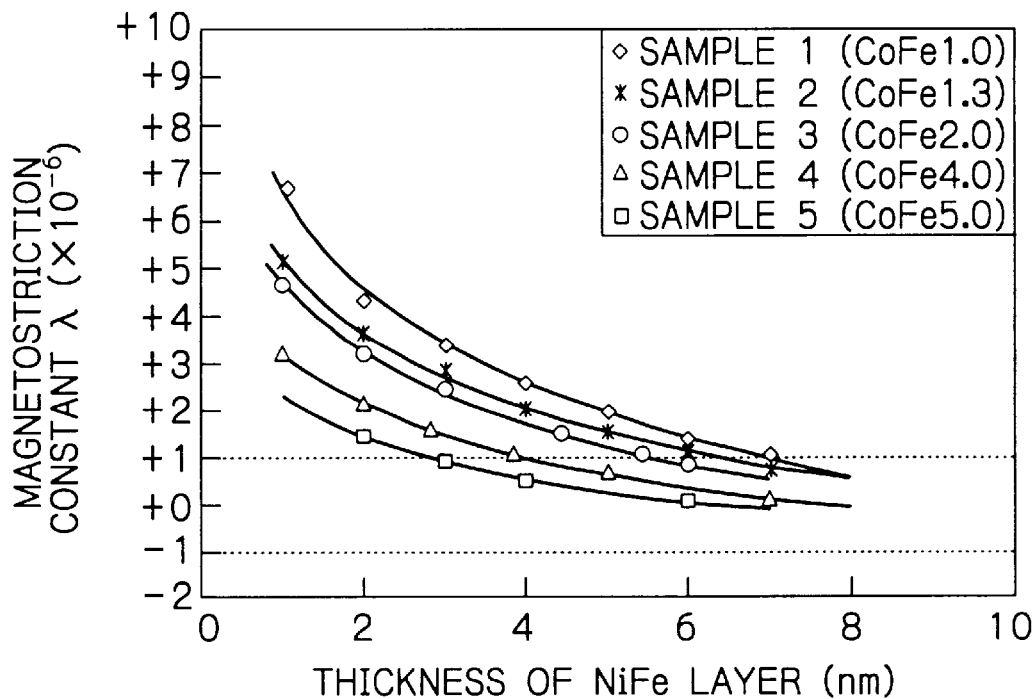
FIG. 5 illustrates characteristics of magnetostriction constants $\lambda$ of various samples each having a CoFe layer with different thickness with respect to change in the thickness of a NiFe layer when no annealing process is performed after deposition.
Figure 6:
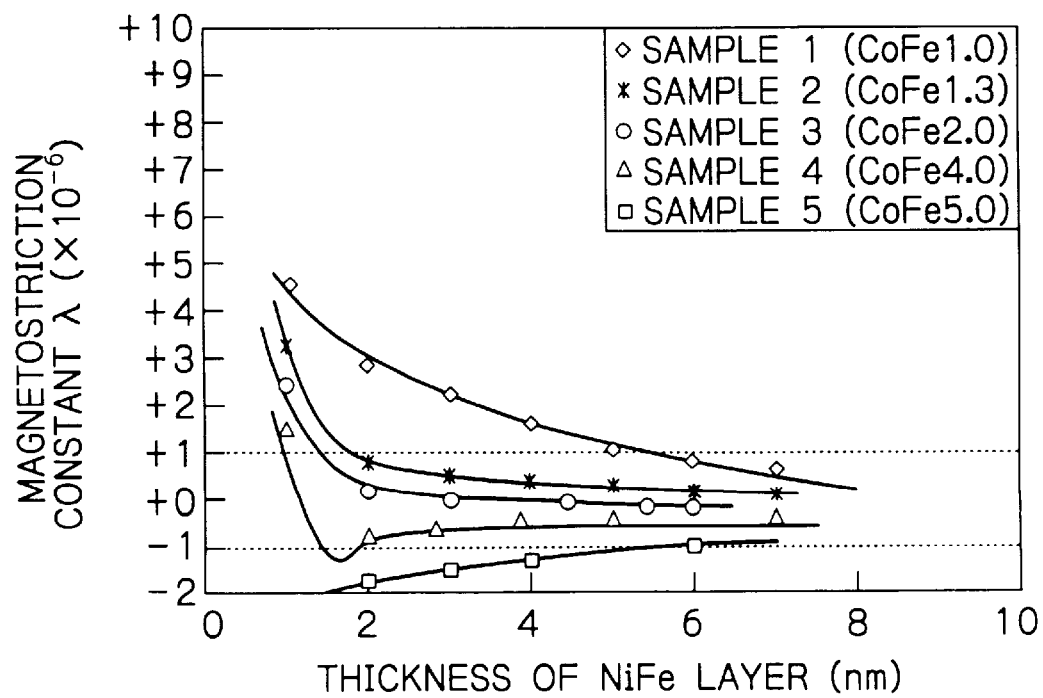
FIG. 6 illustrates characteristics of magnetostriction constants $\lambda$ of various samples each having a CoFe layer with different thickness with respect to change in the thickness of a NiFe layer when an annealing process is performed after deposition.

FIGS. 5 and 6 illustrate characteristics of magnetostriction constants $\lambda$ of samples 1 to 5 each having a CoFe layer 10b with different thickness with respect to change in the thickness of a NiFe layer 10a in case that the free layer 10 has the two-layers structure of the NiFe layer 10a and the CoFe layer 10b as in the above-mentioned embodiment. FIG. 5 is in the case when no annealing process is performed after deposition, and FIG. 6 is in the case when an annealing process as that in the above-mentioned embodiment is performed after deposition.

The samples 1 to 5 have layer constitutions as shown in Table 1, formed on a silicon wafer substrate with a thermal oxidation layer of 0.4 mm thickness. The annealing process is performed by keeping the samples at a temperature of about 250° C. under no magnetic field for about 5 hours and then gradually lowered to the room temperature in about 5 hours.

TABLE 1

| | Ni-composition in NiFe layer (at %) | Fe-composition in CoFe layer (at %) | Layer constitution (thickness (nm)) |
|---|---|---|---|
| Sample 1 | 82 | 10 | Ta(5)/NiFe/CoFe(1.0)/Cu(5) |
| Sample 2 | 82 | 10 | Ta(5)/NiFe/CoFe(1.3)/Cu(5) |
| Sample 3 | 82 | 10 | Ta(5)/NiFe/CoFe(2.0)/Cu(5) |
| Sample 4 | 82 | 10 | Ta(5)/NiFe/CoFe(4.0)/Cu(5) |
| Sample 5 | 82 | 10 | Ta(5)/NiFe/CoFe(5.0)/Cu(5) |

As will be apparent from the comparison of FIGS. 5 and 6, by performing the annealing after the deposition process, variations of the magnetostriction constant $\lambda$ of the free layer depending upon the thickness of the NiFe layer becomes extremely small. Particularly, the samples 3, 4 and 5 (thickness of the CoFe layer is 1.3 nm, 2.0 nm and 4.0 nm, respectively) have small variations of the magnetostriction constant $\lambda$ kept within the range of $-1.0 \times 10^{-6}$ to $+1.0 \times 10^{-6}$ when the thickness of the NiFe layer is 2.0 nm or more.

Figure 7:
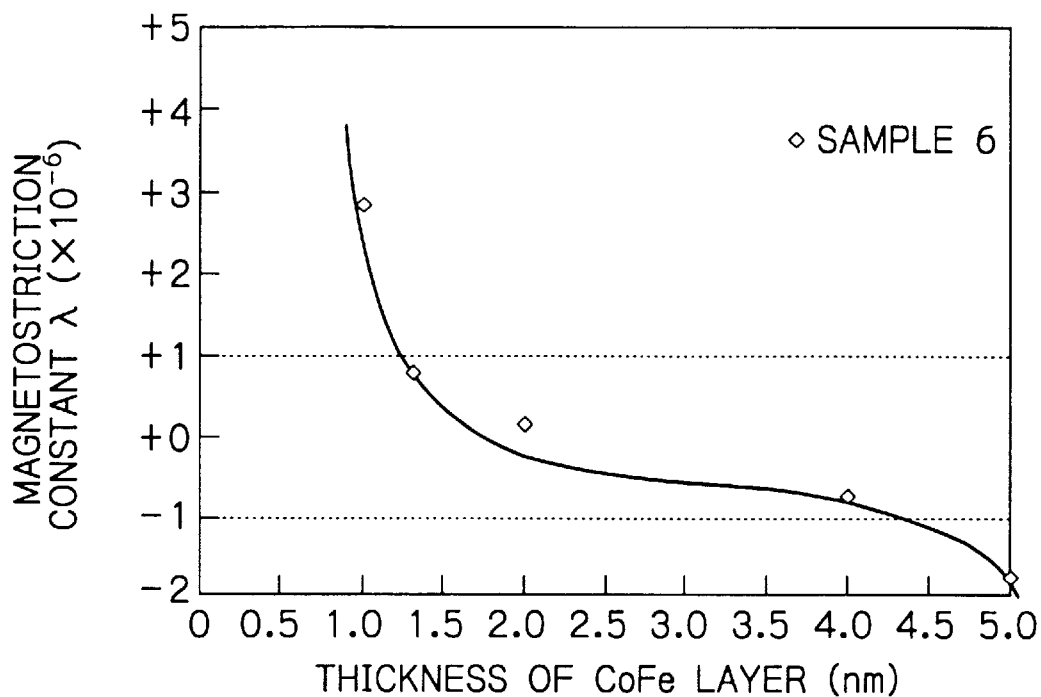
FIG. 7 illustrates characteristics of a magnetostriction constant $\lambda$ of samples each having a NiFe layer with the same thickness with respect to change in the thickness of a CoFe layer.

FIG. 7 illustrates characteristics of magnetostriction constants $\lambda$ of samples 6 each having a NiFe layer 10a with a thickness of 2.0 nm with respect to change in the thickness of a CoFe layer 10b in case that the free layer 10 has the two-layers structure of the NiFe layer 10a and the CoFe layer 10b as in the above-mentioned embodiment. The samples 6 have a layer constitution as shown in Table 2, formed on a silicon wafer substrate with a thermal oxidation layer of 0.4 mm thickness. The annealing process is performed by keeping the samples at a temperature of about 250° C. under no magnetic field for about 5 hours and then gradually lowered to the room temperature in about 5 hours.

TABLE 2

| | Ni-composition in NiFe layer (at %) | Fe-composition in CoFe layer (at %) | Layer constitution (thickness (nm)) |
|---|---|---|---|
| Sample 6 | 82 | 10 | Ta(5)/NiFe(2.0)/CoFe/Cu(5) |

As will be apparent from FIG. 7, when the thickness of the CoFe layer 10b is within a range of 1.2 to 4.3 nm, the magnetostriction constant $\lambda$ is kept within the range of $-1.0 \times 10^{-6}$ to $+1.0 \times 10^{-6}$. Thus, it is desired that the thickness of the CoFe layer 10b is selected to a value within the range of 1.2 to 4.3 nm.

It is indispensable that the free layer 10 has the two-layers structure of the NiFe layer 10a and the CoFe layer 10b. If the free layer is formed by other two-layers structure such as a two-layers structure of a NiFe layer and a Co layer or a two-layers structure of a NiFe layer and a CoFeB layer, since the diffusion mode differs, the advantages as that in the present invention cannot be obtained.

Figure 8:
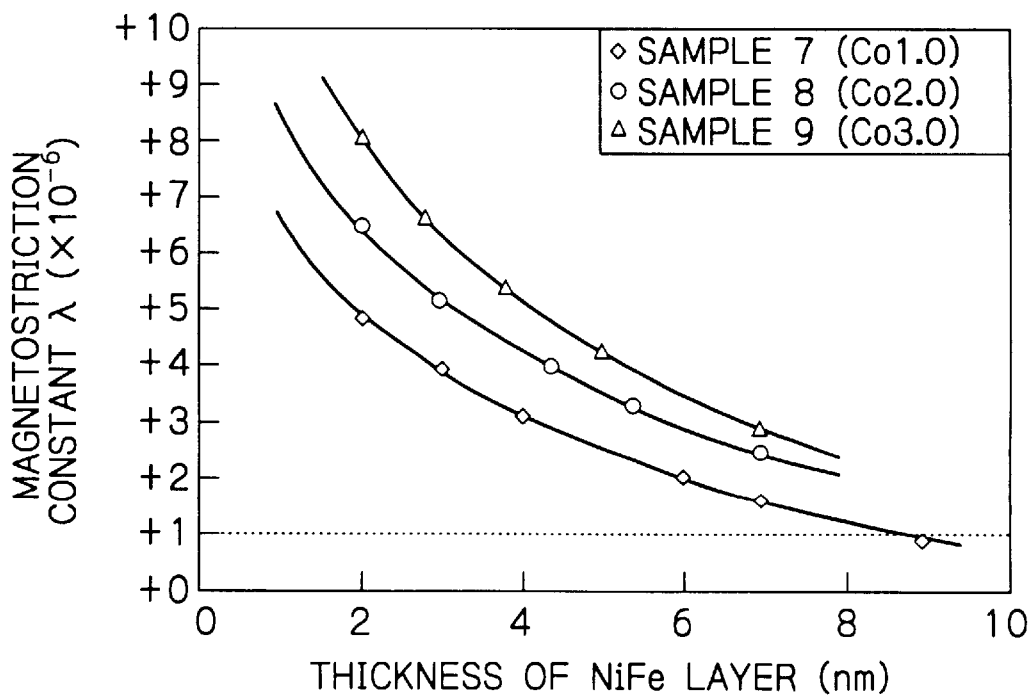
FIG. 8 illustrates characteristics of magnetostriction constants $\lambda$ of various samples each having a Co layer with different thickness with respect to change in the thickness of a NiFe layer when no annealing process is performed after deposition.
Figure 9:
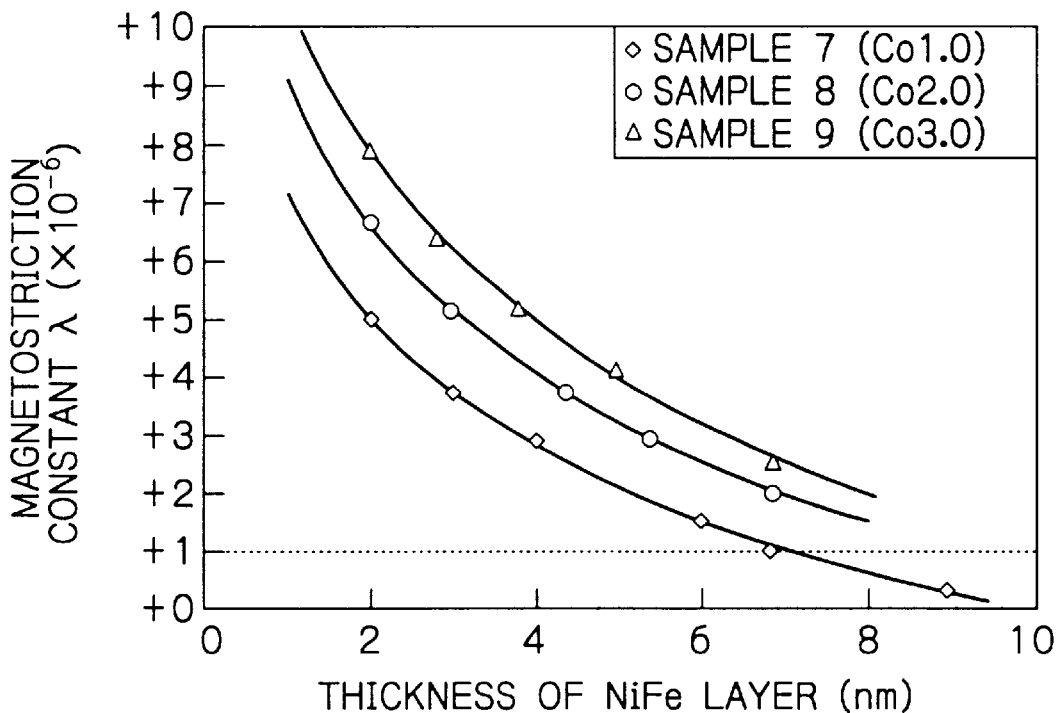
FIG. 9 illustrates characteristics of magnetostriction constants $\lambda$ of various samples each having a Co layer with different thickness with respect to change in the thickness of a NiFe layer when an annealing process is performed after deposition.

FIGS. 8 and 9 illustrate characteristics of magnetostriction constants $\lambda$ of samples 7 to 9 each having a Co layer with different thickness with respect to change in the thickness of a NiFe layer in case that the free layer has a two-layers structure of the NiFe layer and the Co layer. FIG. 8 is in the case when no annealing process is performed after deposition, and FIG. 9 is in the case when an annealing process as that in the above-mentioned embodiment is performed after deposition.

The samples 7 to 9 have layer constitutions as shown in Table 3, formed on a silicon wafer substrate with a thermal oxidation layer of 0.4 m thickness. The annealing process is performed by keeping the samples at a temperature of about 250° C. under no magnetic field for about 5 hours and then gradually lowered to the room temperature in about 5 hours.

TABLE 3

| | Ni-composition in NiFe layer (at %) | Layer constitution (thickness (nm)) |
|---|---|---|
| Sample 7 | 82 | Ta(5)/NiFe/Co(1.0)/Cu(5) |
| Sample 8 | 82 | Ta(5)/NiFe/Co(2.0)/Cu(5) |
| Sample 9 | 82 | Ta(5)/NiFe/Co(3.0)/Cu(5) |

As will be apparent from the comparison of FIGS. 8, 9 and 6, if the free layer is constructed from the two-layers structure of the NiFe layer and the Co layer, variations of the magnetostriction constant $\lambda$ of the free layer depending upon the thickness of the NiFe layer is not improved even when the annealing is executed after the deposition process. If the free layer has such the two-layers structure, it is impossible to obtain the aforementioned advantages of the present invention.

Next, a desired annealing temperature range process executed after the deposition process will be described.

Figure 10:
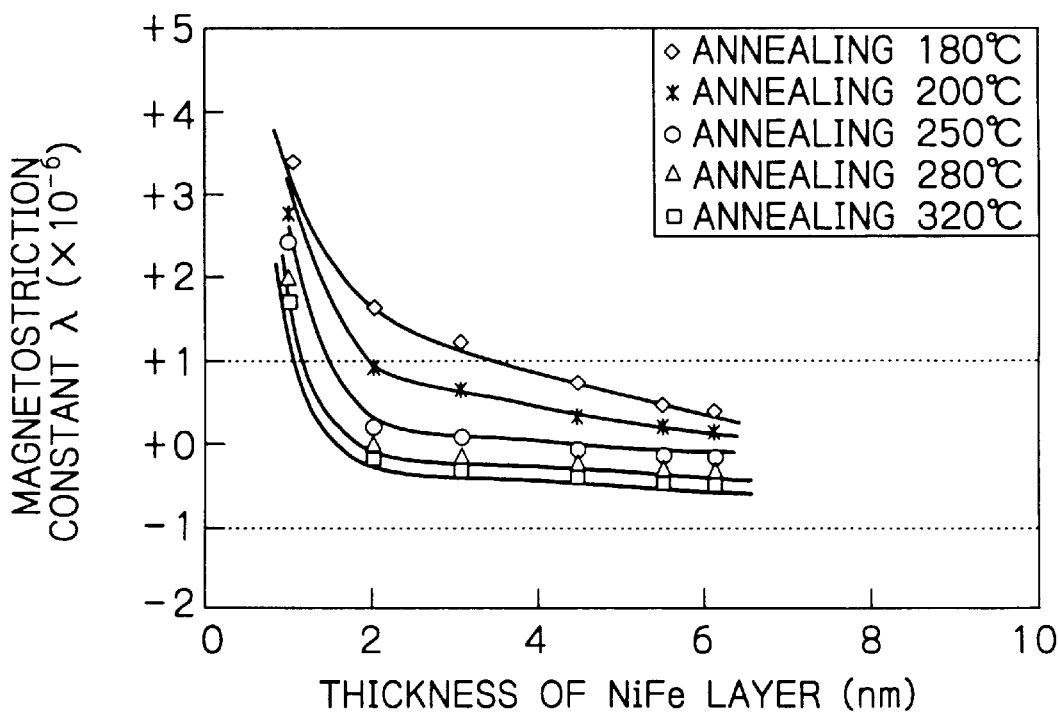
FIG. 10 illustrates characteristics of magnetostriction constants $\lambda$ of samples each having a CoFe layer with the same thickness but processed at different temperature with respect to change in the thickness of a NiFe layer.

FIG. 10 illustrates characteristics of magnetostriction constants $\lambda$ of samples 10 each having a CoFe layer 10b with the same thickness of 2.0 nm but processed at different temperature with respect to change in the thickness of a NiFe layer 10a in case that the free layer 10 has a two-layers structure of the NiFe layer 10a and the CoFe layer 10b as in the above-mentioned embodiment.

The samples 10 have a layer constitution as shown in Table 4, formed on a silicon wafer substrate with a thermal oxidation layer of 0.4 mm thickness. The annealing process is performed by keeping the samples at temperatures of about 180° C., 200° C., 250° C., 280° C. and 320° C., respectively under no magnetic field for about 5 hours and then gradually lowered to the room temperature in about 5 hours.

TABLE 4

| | Ni-composition in NiFe layer (at %) | Fe-composition in CoFe layer (at %) | Layer constitution (thickness (nm)) |
|---|---|---|---|
| Sample 10 | 82 | 10 | Ta(5)/NiFe/CoFe(2.0)/Cu(5) |

As will be apparent from FIG. 10, when the annealing temperature after the deposition process is determined to 200° C. or more and also the thickness of the NiFe layer is 2.0 nm or more, the magnetostriction constant λ is kept within the range of $-1.0 \times 10^{-6}$ to $+1.0 \times 10^{-6}$. Thus, it is desired that the annealing temperature after the deposition process is determined to 200° C. or more.

Figure 11:
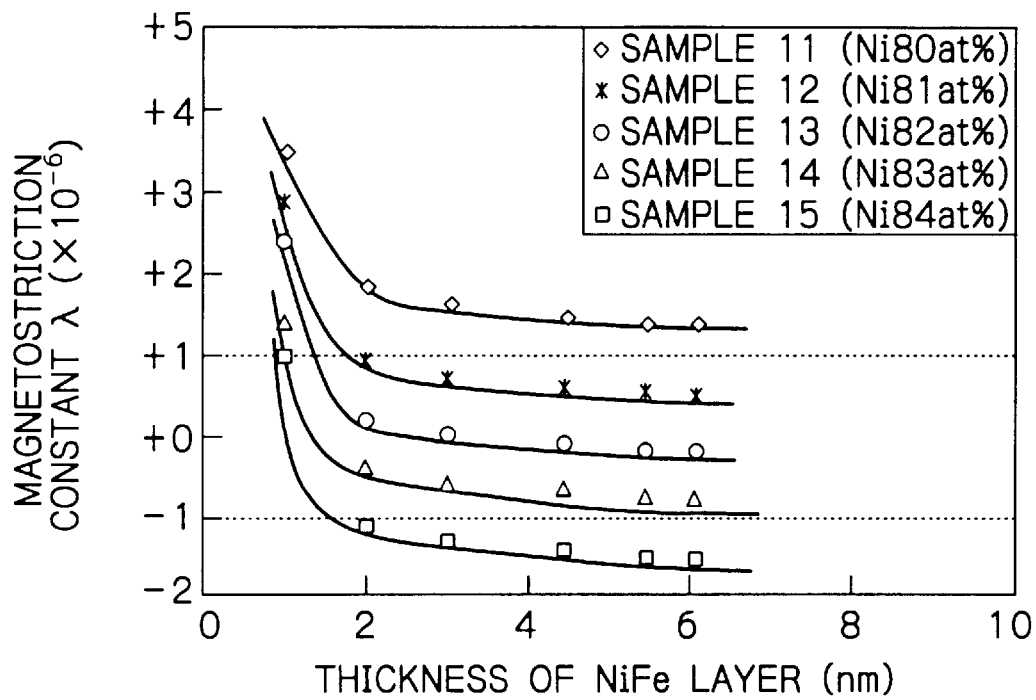
FIG. 11 illustrates characteristics of magnetostriction constants $\lambda$ of various samples each having a NiFe layer with different Ni-composition with respect to change in the thickness of the NiFe layer.

FIG. 11 illustrates characteristics of magnetostriction constants λ of samples 11 to 15 each having a NiFe layer 10a with different Ni-composition with respect to change in the thickness of the NiFe layer 10a in case that the free layer 10 has a two-layers structure of the NiFe layer 10a and the CoFe layer 10b as in the above-mentioned embodiment.

The samples 11 to 15 have layer constitutions as shown in Table 5, formed on a silicon wafer substrate with a thermal oxidation layer of 0.4 mm thickness. The annealing process is performed by keeping the samples at a temperature of about 250° C. under no magnetic field for about 5 hours and then gradually lowered to the room temperature in about 5 hours.

TABLE 5

| | Ni-composition in NiFe layer (at %) | Fe-composition in CoFe layer (at %) | Layer constitution (thickness (nm)) |
|---|---|---|---|
| Sample 11 | 80 | 10 | Ta(5)/NiFe/CoFe(2.0)/Cu(5) |
| Sample 12 | 81 | 10 | Ta(5)/NiFe/CoFe(2.0)/Cu(5) |
| Sample 13 | 82 | 10 | Ta(5)/NiFe/CoFe(2.0)/Cu(5) |
| Sample 14 | 83 | 10 | Ta(5)/NiFe/CoFe(2.0)/Cu(5) |
| Sample 15 | 84 | 10 | Ta(5)/NiFe/CoFe(2.0)/Cu(5) |

As will be apparent from FIG. 11, when the Ni-composition in the NiFe layer 10a is within a range of 81 to 83 at % and also the thickness of the NiFe layer 10a is 2.0 nm or more, the magnetostriction constant λ is kept within the range of $-1.0 \times 10^{-6}$ to $+1.0 \times 10^{-6}$. Thus, it is desired that the Ni-composition in the NiFe layer 10a is within a range of 81 to 83 at %.

Figure 12:
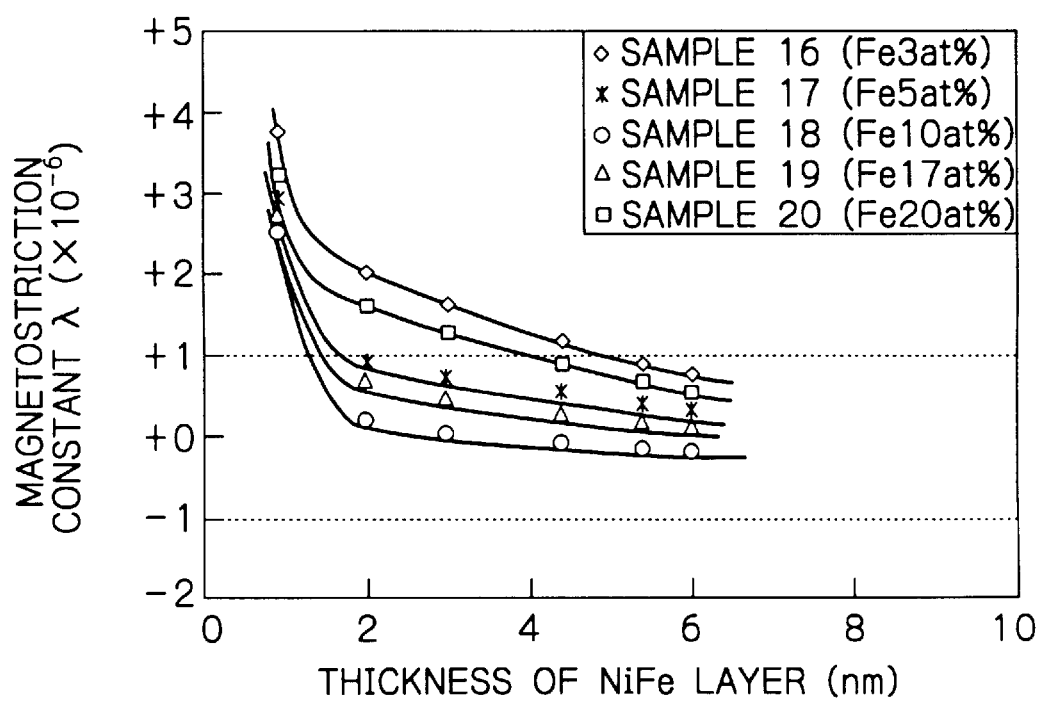
FIG. 12 illustrates characteristics of magnetostriction constants $\lambda$ of various samples each having a CoFe layer with different Fe-composition with respect to change in the thickness of a NiFe layer.

FIG. 12 illustrates characteristics of magnetostriction constants λ of samples 16 to 20 each having a CoFe layer 10b with different Fe-composition with respect to change in the thickness of a NiFe layer 10a in case that the free layer 10 has a two-layers structure of the NiFe layer 10a and the CoFe layer 10b as in the above e-mentioned embodiment.

The samples 16 to 20 have layer constitutions as shown in Table 6, formed on a silicon wafer substrate with a thermal oxidation layer of 0.4 mm thickness. The annealing process is performed by keeping the samples at a temperature of about 250° C. under no magnetic field for about 5 hours and then gradually lowered to the room temperature in about 5 hours.

TABLE 6

| | Ni-composition in NiFe layer (at %) | Fe-composition in CoFe layer (at %) | Layer constitution (thickness (nm)) |
|---|---|---|---|
| Sample 16 | 82 | 3 | Ta(5)/NiFe/CoFe(2.0)/Cu(5) |
| Sample 17 | 82 | 5 | Ta(5)/NiFe/CoFe(2.0)/Cu(5) |
| Sample 18 | 82 | 10 | Ta(5)/NiFe/CoFe(2.0)/Cu(5) |
| Sample 19 | 82 | 17 | Ta(5)/NiFe/CoFe(2.0)/Cu(5) |
| Sample 20 | 82 | 20 | Ta(5)/NiFe/CoFe(2.0)/Cu(5) |

As will be apparent from FIG. 12, when the Fe-composition in the CoFe layer 10b is within a range of 5 to 17 at % and also the thickness of the NiFe layer 10a is 2.0 nm or more, the magnetostriction constant λ is kept within the range of $-1.0 \times 10^{-6}$ to $+1.0 \times 10^{-6}$. Thus, it is desired that the Fe-composition in the CoFe layer 10b is within a range of 5 to 17 at %.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of manufacturing a spin valve magnetoresistive effect element with a non-magnetic metallic thin-film layer, first and second ferromagnetic thin-film layers formed to sandwich said non-magnetic metallic thin-film layer and an anti-ferromagnetic thin-film layer formed in contact with a surface of said second ferromagnetic thin-film layer, said surface being opposite to said non-magnetic metallic thin-film layer, said first ferromagnetic thin-film layer having a two-layers structure of a NiFe layer and a CoFe layer, said method comprising the steps of:

depositing said first ferromagnetic thin-film layer, said non-magnetic metallic thin-film layer, said second ferromagnetic thin-film layer and said anti-ferromagnetic thin-film layer; and thereafter, annealing said deposited layers so that change in magnetostriction depending upon variation of a thickness of said NiFe layer becomes small.

2. The method as claimed in claim 1, wherein said CoFe layer has a thickness within a range of 1.2 to 4.3 nm.

3. The method as claimed in claim 1, wherein said NiFe layer has a thickness of 2 nm or more.

4. The method as claimed in claim 1, wherein said NiFe layer has a composition of Ni within a range of 81 to 83 at %.

5. The method as claimed in claim 1, wherein said CoFe layer has a composition of Fe within a range of 5 to 17 at %.

6. The method as claimed in claim 1, wherein said NiFe layer has a composition of Ni within a range of 81 to 83 at %, and said CoFe layer has a thickness within a range of 1.2 to 4.3 nm.

7. The method as claimed in claim 1, wherein said annealing step includes annealing the deposited layers at a temperature of 200° C. or more.

8. A method of manufacturing a thin-film magnetic head with a spin valve magnetoresistive effect element fabricated by said manufacturing method as claimed in claim 1.

9. A method of manufacturing a spin valve magnetoresistive effect element comprising the steps of:

depositing a first ferromagnetic thin-film layer to form a two-layers structure of a NiFe layer and a CoFe layer;

depositing a non-magnetic metallic thin-film layer on said first ferromagnetic thin-film layer;

depositing a second ferromagnetic thin-film layer on said non-magnetic metallic thin-film layer;

depositing an anti-ferromagnetic thin-film layer on said second ferromagnetic thin-film layer; and thereafter, annealing said deposited layers so that change in magnetostriction depending upon variation of a thickness of said NiFe layer becomes small.

10. A method of manufacturing a spin valve magnetoresistive effect element comprising the steps of:

depositing an anti-ferromagnetic thin-film layer;

depositing a second ferromagnetic thin-film layer on said anti-ferromagnetic thin-film layer;

depositing a non-magnetic metallic thin-film layer on said second ferromagnetic thin-film layer;

depositing a first ferromagnetic thin-film layer on said non-magnetic metallic thin-film layer to form a two-layers structure of a CoFe layer and a NiFe layer; and thereafter, annealing said deposited layers so that change in magnetostriction depending upon variation of a thickness of said NiFe layer becomes small.

* * * * *

UNITED STATES PATENT AND TRADEMARK OFFICE
CERTIFICATE OF CORRECTION

PATENT NO. : 6,364,964 B1
DATED : April 2, 2002
INVENTOR(S) : Sasaki et al.

It is certified that error appears in the above-identified patent and that said Letters Patent is hereby corrected as shown below:

Title page,
Item [*] Notice, delete the phrase "by 0 days" and insert -- by 31 days --

Signed and Sealed this

Twelfth Day of October, 2004

JON W. DUDAS
*Director of the United States Patent and Trademark Office*